(12) United States Patent
Park et al.

(10) Patent No.: US 9,343,484 B2
(45) Date of Patent: May 17, 2016

(54) THIN FILM TRANSISTOR SUBSTRATE AND DISPLAY APPARATUS INCLUDING THE SAME

(71) Applicant: Samsung Display Co., Ltd., Yongin (KR)

(72) Inventors: Gyungsoon Park, Yongin (KR); Keumnam Kim, Yongin (KR); Changho Lee, Yongin (KR); Minjae Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/676,269

(22) Filed: Apr. 1, 2015

(65) Prior Publication Data

US 2016/0064411 A1 Mar. 3, 2016

(30) Foreign Application Priority Data

Aug. 28, 2014 (KR) .......................... 10-2014-0113350

(51) Int. Cl.
*H01L 29/20* (2006.01)
*H01L 27/12* (2006.01)
*H01L 27/15* (2006.01)

(52) U.S. Cl.
CPC ............ *H01L 27/124* (2013.01); *H01L 27/156* (2013.01)

(58) Field of Classification Search
CPC .................................................... H01L 27/124

USPC ........................................................... 257/89
See application file for complete search history.

(56) References Cited

U.S. PATENT DOCUMENTS

| | | | |
|---|---|---|---|
| 5,790,213 | A | 8/1998 | Sasaki et al. |
| 2005/0259142 | A1 | 11/2005 | Kwak |
| 2006/0114193 | A1 | 6/2006 | Kwak et al. |
| 2008/0036371 | A1 | 2/2008 | Kim |

FOREIGN PATENT DOCUMENTS

| | | |
|---|---|---|
| KR | 10-1996-0011523 | 4/1996 |
| KR | 10-2005-0111923 | 11/2005 |
| KR | 10-2006-0056791 | 5/2006 |
| KR | 10-2008-0013281 | 2/2008 |
| KR | 10-2014-0042553 | 4/2014 |

*Primary Examiner* — Anthony Ho
(74) *Attorney, Agent, or Firm* — H.C. Park & Associates, PLC

(57) ABSTRACT

A thin film transistor substrate and a display apparatus including the same are provided. The thin film transistor substrate includes a plurality of pixels each including: a first transistor for receiving a data signal in response to a first gate control signal; a second transistor for outputting a driving current according to the data signal applied to a gate electrode of the second transistor; and a third transistor for initializing a gate node connected to the gate electrode of the second transistor in response to a second gate control signal, wherein first electrodes of the third transistors of at least some adjacent pixels of the plurality of pixels are connected to the gate node, and second electrodes thereof are connected to a shared transistor that applies an initialization voltage to the second electrodes.

18 Claims, 11 Drawing Sheets

THIN FILM TRANSISTOR SUBSTRATE AND DISPLAY APPARATUS INCLUDING THE SAME

CROSS-REFERENCE TO RELATED APPLICATION

This application claims the benefit of Korean Patent Application No. 10-2014-0113350, filed on Aug. 28, 2014, in the Korean Intellectual Property Office, the disclosure of which is incorporated herein in its entirety by reference.

BACKGROUND

1. Field

One or more embodiments of the present disclosure relate to a thin film transistor substrate and a display apparatus including the same.

2. Description

A display apparatus may be formed as a transparent display apparatus by utilizing a transparent thin film transistor (TFT) or other transparent display device.

When operating in transparent mode, the transparent display apparatus transfers light reflected by an object, or an image, to a user by transmitting the light through a display device, a plurality of TFTs, a pattern such as various wirings, and spaces therebetween. However, the transparent display apparatus has a low light transmittance rate due to space limitations of the display device, the TFTs, and the wiring.

SUMMARY

One or more embodiments of the present disclosure include a transparent display apparatus capable of providing a larger light transmission area.

Additional aspects will be set forth in part in the description which follows and, in part, will be apparent from the description, or may be learned by practice of the presented embodiments.

According to one or more embodiments of the present disclosure, a thin film transistor substrate including a plurality of pixels each comprises: a first transistor for receiving a data signal in response to a first gate control signal; a second transistor for outputting a driving current according to the data signal applied to a gate electrode of the second transistor; and a third transistor for initializing a gate node connected to the gate electrode of the second transistor in response to a second gate control signal, wherein first electrodes of the third transistors of at least some adjacent pixels among the plurality of pixels are connected to the gate node, and second electrodes thereof are connected to a shared transistor that applies an initialization voltage to the second electrodes.

Each of the plurality of pixels may comprises a first region that emits light on at least one surface and a second region that is adjacent to the first region which transmits external light, where the first through third transistors are disposed in the first region.

The second regions of the plurality of pixels may be connected to each other.

Each of the plurality of pixels may further include a display device in the first region, where the display device is disposed to overlap with the first through third transistors.

A gate electrode of the shared transistor may be connected to gate electrodes of the third transistors and connected between the second electrodes of the third transistors and an initialization voltage line via which the initialization voltage is applied. Widths of any particular gate electrode may be different from each other.

A third transistor of a pixel that is not connected to the shared transistor may include two sub-transistors that are connected to each other in series where one of the two sub-transistors may be connected to the gate node and the other of the two sub-transistors may be connected to the initialization voltage line via which the initialization voltage is applied.

Each of the plurality of pixels may further comprise a fourth transistor for initializing one electrode of an emission device in response to the first gate control signal, and the fourth transistors of the plurality of pixels are disposed close to each other.

The gate electrodes of the fourth transistors of the plurality of pixels may be directly connected to each other, the first electrodes of the fourth transistors may be connected to one electrode of the emission device, and the second electrodes of the fourth transistors may be directly connected to each other and an initialization voltage line through connection wiring.

The thin film transistor substrate may further include a data line extending in a first direction for applying the data signal to the plurality of pixels, a first control line extending in a second direction for applying the first gate control signal to the plurality of pixels, a second control line extending in the second direction for applying the second gate control signal to the plurality of pixels, and an initialization voltage line extending in the second direction for applying the initialization voltage to the plurality of pixels.

Each of the plurality of pixels may further comprise a fourth transistor connected between one electrode of an emission device and the initialization voltage line, wherein the fourth transistors of the plurality of pixels are parallel and adjacent to each other.

Each of the plurality of pixels may further comprise a fifth transistor for diode-connecting the second transistor which responds to the first gate control signal.

The data signal may be applied to a first node via the first transistor, and the second transistor may be diode-connected by the fifth transistor to transfer the data signal of the first node to the gate node.

The fifth transistor may include two sub-transistors that are connected to each other in series.

The plurality of pixels may emit light of different colors and are adjacent to each other.

The plurality of pixels may include a red pixel, a green pixel, and a blue pixel that are adjacent to each other.

The pixels that are connected to the shared transistor from among the plurality of pixels may be the green pixel and the blue pixel.

Each of the red, green, and blue pixels may include a fourth transistor for initializing one electrode of an emission device in response to the first gate control signal, wherein the fourth transistors are disposed in parallel and close to each other, between the red pixel and the green pixel or the blue pixel adjacent to the red pixel.

According to one or more embodiments of the present disclosure, a display apparatus including the thin film transistor substrate.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION OF THE ILLUSTRATED EMBODIMENTS

Figure 1:
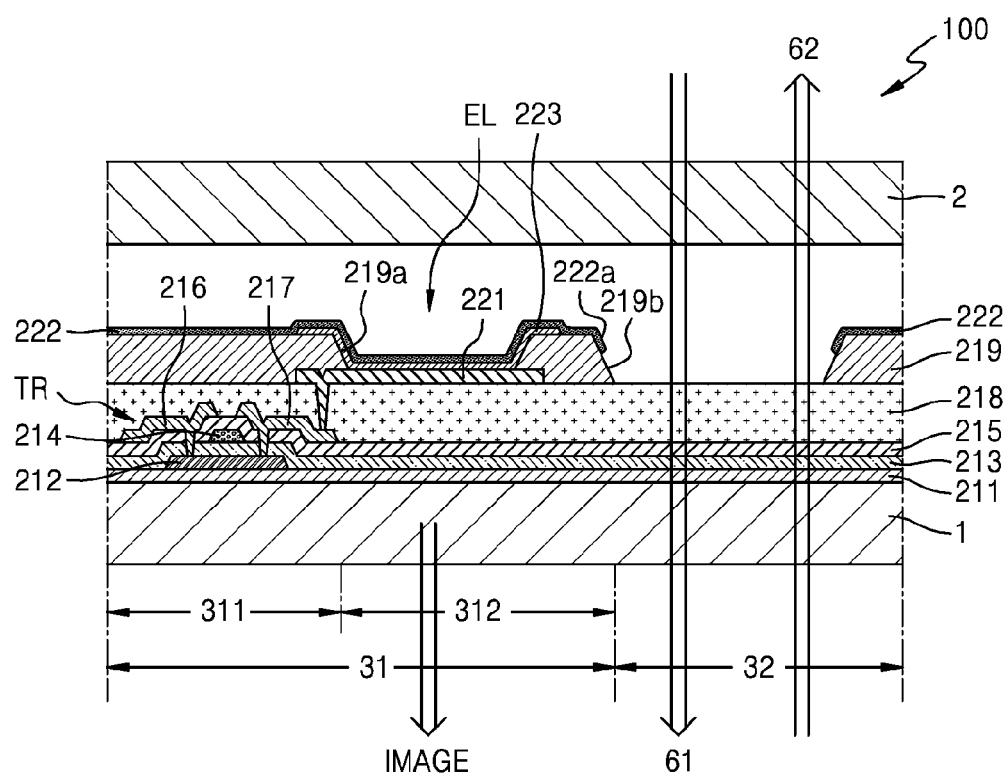
FIG. 1 is a schematic cross-sectional view illustrating a part of a display apparatus according to an embodiment of the present disclosure.

Reference will now be made in detail to embodiments, examples of which are illustrated in the accompanying drawings. Effects and features of the embodiments, and implementation methods thereof will be clarified through the following descriptions given with reference to the accompanying drawings. In this regard, the embodiments may have different forms and should not be construed as being limited to the descriptions set forth herein.

In the following descriptions of the embodiments, although the terms "first and second" are used to describe various elements, these elements should not be limited by these terms. These terms are only used to distinguish one element from another element.

In the following descriptions of the embodiments, the terms of a singular form may include plural forms unless referred to the contrary.

In the following descriptions of the embodiments, the meaning of "include," "comprise," "including," or "comprising," specifies a property, a region, a fixed number, a step, a process, an element, a component, and a combination thereof but does not exclude other properties, regions, fixed numbers, steps, processes, elements, components, and combinations thereof.

It will be understood that when a film, a region, or an element is referred to as being "above" or "on" another film, region, or element, it can be directly on the other film, region, or element, or intervening films, regions, or elements may also be present.

In the drawings, the sizes of elements may be exaggerated for clarity. For example, in the drawings, the size or thickness of each element may be arbitrarily shown for illustrative purposes, and thus the present disclosure should not be construed as being limited thereto.

Figure 2:
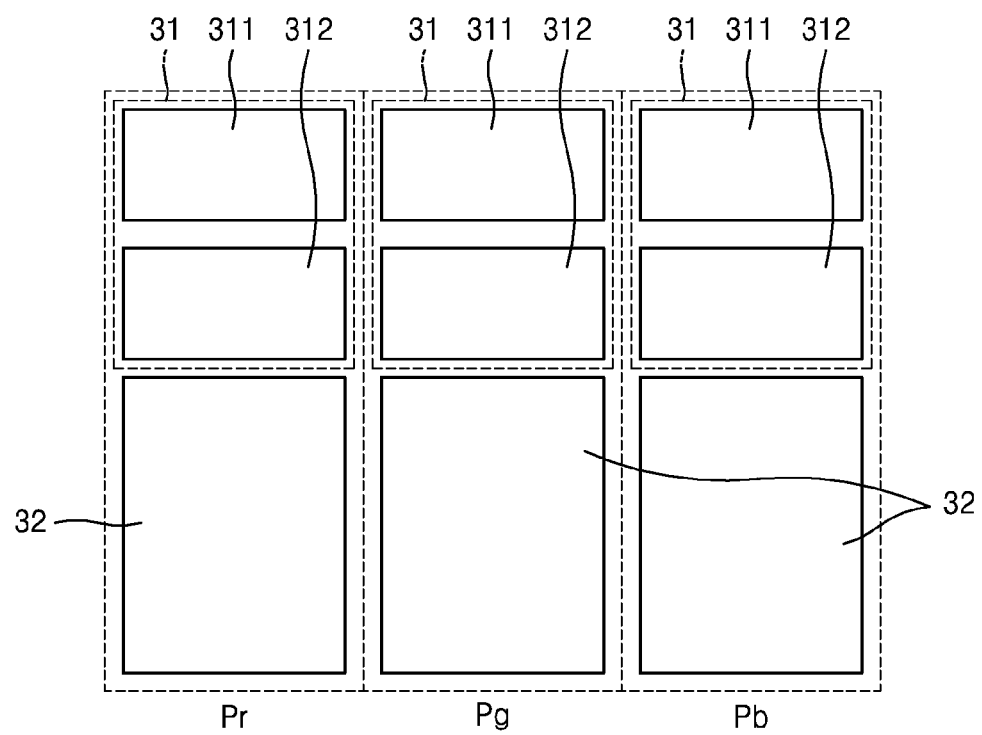
FIGS. 2 and 3 are a pixel included in the display apparatus of FIG. 1.
Figure 3:
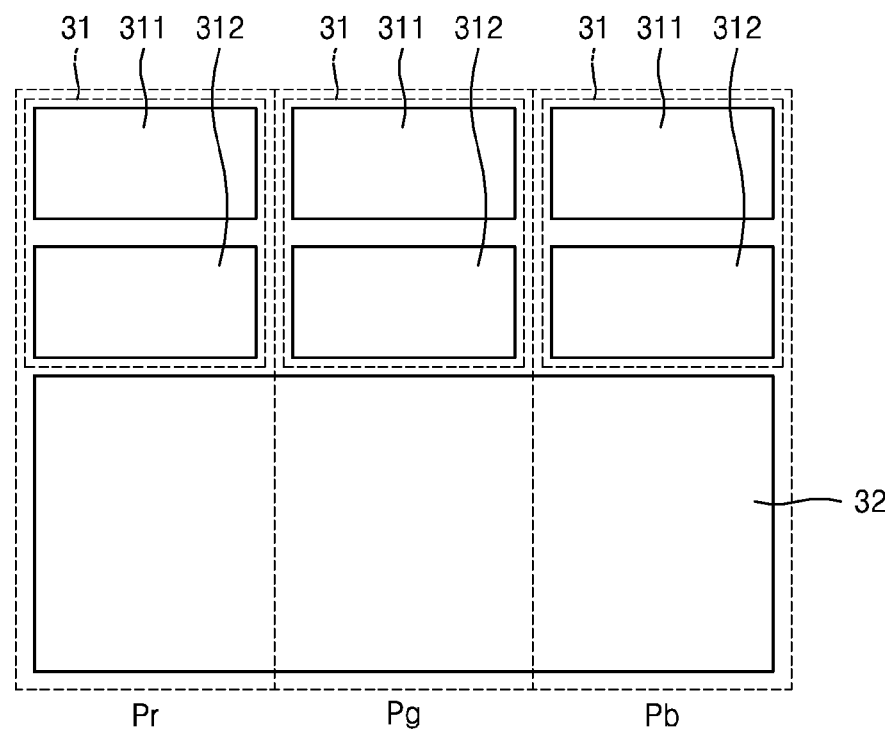

FIG. 1 is a schematic cross-sectional view illustrating a part of a display apparatus 100 according to an embodiment of the present disclosure. FIGS. 2 and 3 are pixels included in the display apparatus 100 of FIG. 1.

Referring to FIGS. 1 through 3, the display apparatus 100 may be a bottom emission organic light emitting display apparatus, and may include a first substrate 1, a display unit provided on the first substrate 1, and a second substrate 2 that seals the display unit. The display unit includes a plurality of pixels that includes a pixel region 31 that emits light in the direction of the first substrate 1 and a transmission region 32 that is adjacent to the pixel region 31 and transmits external light. The plurality of pixels are aligned in row and column directions in the form of a matrix.

According to an embodiment of the present disclosure, when the display apparatus 100 is in a transparent mode in which light is transmitted, a user at the side where an image is formed may observe an image on the outer side of the second substrate 2 due to a first external light 61 that is transmitted from the outer side of the second substrate 2 to an outer side of the first substrate 1. A user at the opposite side of where the image is formed may also observe an image on the outer side of the first substrate 1 due to a second external light 62 that is transmitted from the outer side of the first substrate 1 to the outer side of the second substrate 2. In this regard, the first external light 61 travels in a direction from the second substrate 2 toward the first substrate 1, and the second external light 62 travels in a direction opposite to that of the first external light 61.

When the display apparatus 100 is a black mode in which light is not transmitted, the user at the side where the image is formed may not observe the image on the outer side of the second substrate 2. The user at the opposite side to where the image is formed may also not observe the image on the outer side of the first substrate 1.

Each of the pixels may include a plurality of sub pixels, for example, a red sub pixel Pr, a green sub pixel Pg, and a blue sub pixel Pb. Each of the sub pixels Pr, Pg, and Pb includes the pixel region 31 and the transmission region 32. The pixel region 31 includes a pixel circuit unit 311 and an emission unit 312. The pixel circuit unit 311 and the emission unit 312 are adjacent to each other such that they do not overlap. The emission unit 312 is a bottom emission type in which light is emitted in a direction of the first substrate 1, thus light from the emission unit 312 does not interfere with a the pixel circuit unit 311.

The transmission region 32 that transmits the external light is adjacent to the pixel region 31.

The transmission regions 32 may be independently provided in the sub pixels Pr, Pg, and Pb, as shown in FIG. 2, and may be connected to act as a transmission window in the sub pixels Pr, Pg, and Pb, as shown in FIG. 3. That is, with regard to the entire display unit, each of the pixels may include the pixel regions 31 that are spaced apart from each other and the transmission region 32. FIG. 3 shows a larger area of the transmission region 32 that transmits the external light, thereby increasing an entire transmittance of the display unit.

The transmission regions 32 of the red sub pixel Pr, the green sub pixel Pg, and the blue sub pixel Pb are connected to each other in FIG. 3 but the present disclosure is not necessarily limited thereto. The transmission regions 32 of two adjacent sub pixels among the red sub pixel Pr, the green sub pixel Pg, and the blue sub pixel Pb may be connected to each other.

As shown in FIG. 1, a single thin film transistor TR is disposed in the pixel circuit unit 311 of the pixel region 31 but the present disclosure is not necessarily limited thereto. A pixel circuit including the thin film transistor TR may be provided. The pixel circuit may further include a plurality of thin film transistors and a storage capacitor in addition to the thin film transistor TR. The pixel circuit may also further include wirings such as a scan line, a data line, an initialization line, and a power voltage line, etc. that are connected to the thin film transistors and the storage capacitor.

An emission device EL is disposed in the emission unit 312 of the pixel region 31. The emission device EL may be an organic light emitting device (OLED). The OLED is electrically connected to the thin film transistor TR of the pixel circuit.

A buffer layer 211 is formed on the first substrate 1. The pixel circuit including the thin film transistor TR is formed on the buffer layer 211.

An active layer 212 is formed on the buffer film 211.

The buffer layer 211 prevents penetration of impurity elements, and planarizes the surface of the first substrate 1, and may be formed of various materials that are capable of performing these functions. For example, the buffer layer 211 may be formed of an inorganic material such as silicon oxide, silicon nitride, silicon oxynitride, aluminum oxide, aluminum nitride, titanium oxide, or titanium nitride; an organic material such as polyimide, polyester, or acryl; or a stack structure including inorganic and organic materials. The buffer layer 211 is not an essential element and may be excluded.

The active layer 212 may be formed of polycrystalline silicon, but is not limited thereto, and may also be formed of an oxide semiconductor. For example, the active layer 212 may be a G-I—Z—O layer [$(In_2O_3)a(Ga_2O_3)b(ZnO)c$ layer] (where a, b, and c are real numbers that respectively satisfy the conditions of $a \geq 0$, $b \geq 0$, and $c > 0$). The active layer 212 formed of the oxide semiconductor may further increase light transmittance of the pixel circuit unit 311 of the pixel region 31, and thus external light transmittance of the entire display unit.

A gate insulating layer 213 is formed on the buffer layer 211 to cover the semiconductor active layer 212, and a gate electrode 214 is formed on the gate insulating layer 213.

An interlayer insulating layer 215 is formed on the gate insulating layer 213 to cover the gate electrode 214. A source electrode 216 and a drain electrode 217 are formed on the interlayer insulating layer 215 so that the first source and drain electrodes 216 and 217 respectively contact the semiconductor active layer 212 through contact holes.

A structure of the thin film transistor TR as described above is not limited thereto, and various structures of the thin film transistor TR may be applicable.

The source electrode 216 and the drain electrode 217 of the thin film transistor TR are formed on different layers from the semiconductor active layer 212 in FIG. 1 but the present disclosure is not limited thereto. At least one of the source electrode 216 or the drain electrode 217 of the thin film transistor TR may be formed on the same layer as the semiconductor active layer 212.

A passivation layer 218 is formed to cover the thin film transistor TR. The passivation layer 218 may be an insulating layer including a single layer or a plurality of layers that have a planarized upper surface. The passivation layer 218 may be formed by using an inorganic material and/or an organic material. The passivation layer 218 may be formed to cover the pixel region 31 and the transmission region 32. However, the passivation layer 218 is not limited thereto. Although not shown, the passivation layer 218 includes an opening (not shown) at a location corresponding to the transmission region 32, thereby further increasing external light transmission efficiency of the transmission region 32.

The first electrode 221 of the OLED EL is electrically connected to the thin film transistor TR and is formed on the passivation layer 218. The first electrode 221 may be formed in the form of an island in each of the sub pixels Pr, Pg, and Pb. The first electrode 221 is disposed in the emission unit 312 of the pixel region 31 so that the first electrode 221 does not overlap with the pixel circuit unit 311.

A pixel-defining layer 219 formed of organic and/or inorganic insulation materials may be formed on the passivation layer 218.

The pixel-defining layer 219 includes a third opening 219a to cover edges of the first electrode 221 and expose a center portion thereof. The pixel-defining layer 219 may be provided to cover the pixel region 31 but is not limited thereto. The pixel-defining layer 219 may be enough to cover at least a part, in particular, edges of the first electrode 221. The pixel-defining layer 219 may include a second opening 219b at a location corresponding to the transmission region 32. The pixel-defining layer 219 is not disposed in the transmission region 32, thereby further increasing the external light transmission efficiency of the transmission region 32.

The passivation layer 218 and the pixel-defining layer 219 may be formed of transparent materials. The insulating layer is formed of a transparent material, thereby further increasing external light transmission efficiency of a display apparatus 100.

An organic layer 223 and a second electrode 222 are sequentially stacked on the first electrode 221 exposed through the third opening 219a. The second electrode 222 faces the first electrode 221, covers the organic layer 223 and the pixel-defining layer 219, and is disposed in the pixel region 31. The second electrode 222 is formed at least in the pixel region 31 and may include the first opening 222a at a location corresponding to the transmission region 32. The second electrode 222 is not disposed in the transmission region 32, thereby further increasing the external light transmission efficiency of the transmission region 32. The first opening 222a and the second opening 219b are connected to each other.

The organic layer 223 includes an emission layer (EML) and has a monolayer or multilayer structure of a hole injection layer (HIL), a hole transport layer (HTL), an electron transport layer (ETL), and an electron injection layer (EIL). The HIL, the HTL, the ETL, and the EIL is a common layer and may be commonly applied to the red, green, and blue sub pixels Pr, Pg, and Pb.

The first electrode 221 may function as an anode electrode, and the second electrode 222 may function as a cathode electrode. However, polarities of the first electrode 221 and the second electrode 222 may also be switched.

According to an embodiment of the present disclosure, the first electrode 221 may be a transparent electrode, and the second electrode 222 may be a reflective electrode. The first electrode 221 may include a transparent conductive material such as ITO, IZO, ZnO, or $In_2O_3$. The second electrode 222 may be formed of Ag, Mg, Al, Pt, Pd, Au, Ni, Nd, Ir, Cr, Li, or Ca. Thus, the OLED is a bottom emission type in which an image is formed in a direction of the first electrode 221. In this case, the second electrode may be formed as sufficient thickness such that a voltage drop does not occur in the entire display unit, and thus applicable to the large sized display apparatus 100.

Although not shown in FIG. 1, the display apparatus 100 may include various optical members such as a polarizer and a retarder outside the first substrate 1 and the second substrate 2 which may control transmittance of the external light by using the optical members.

Figure 4:
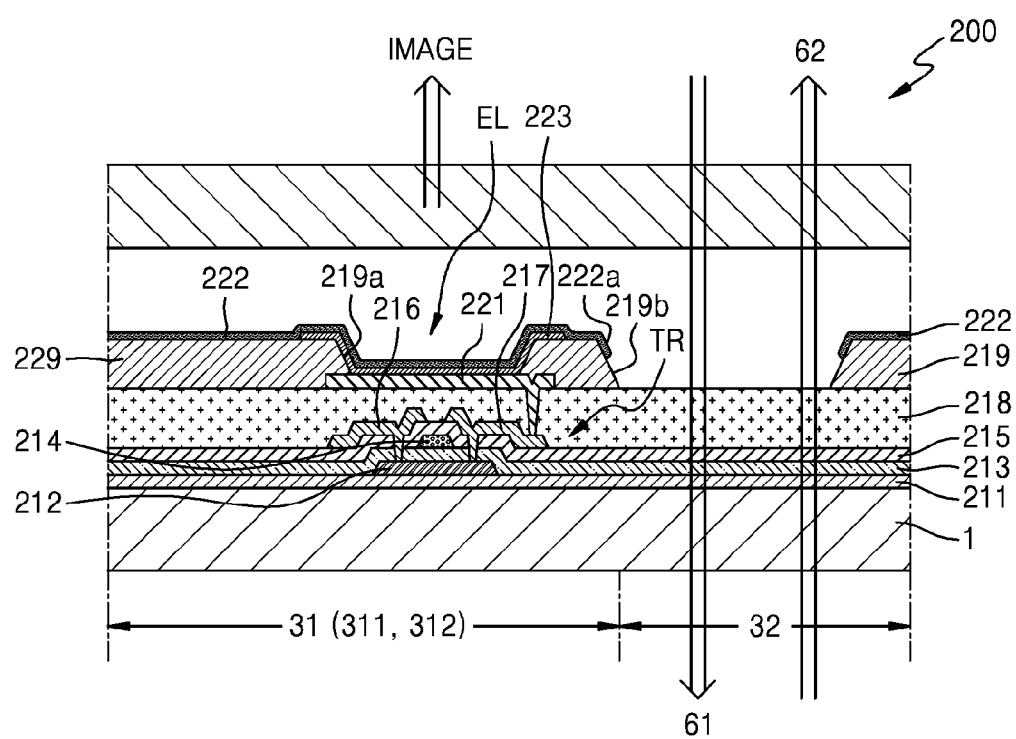
FIG. 4 is a schematic cross-sectional view illustrating a part of a display apparatus according to another embodiment of the present disclosure.
Figure 5:
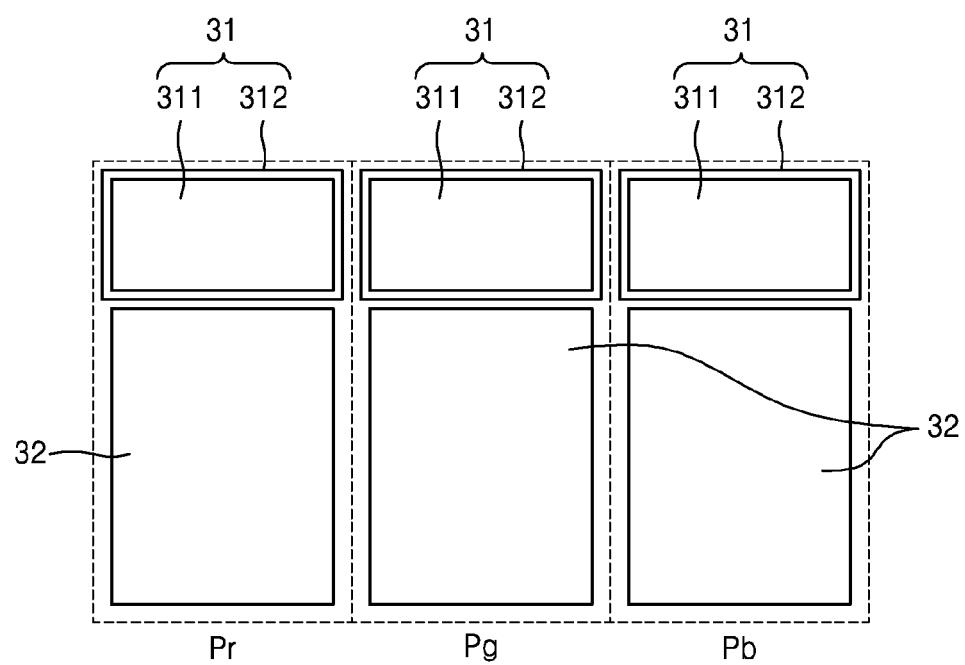
FIGS. 5 and 6 are a pixel included in the display apparatus of FIG. 4.
Figure 6:
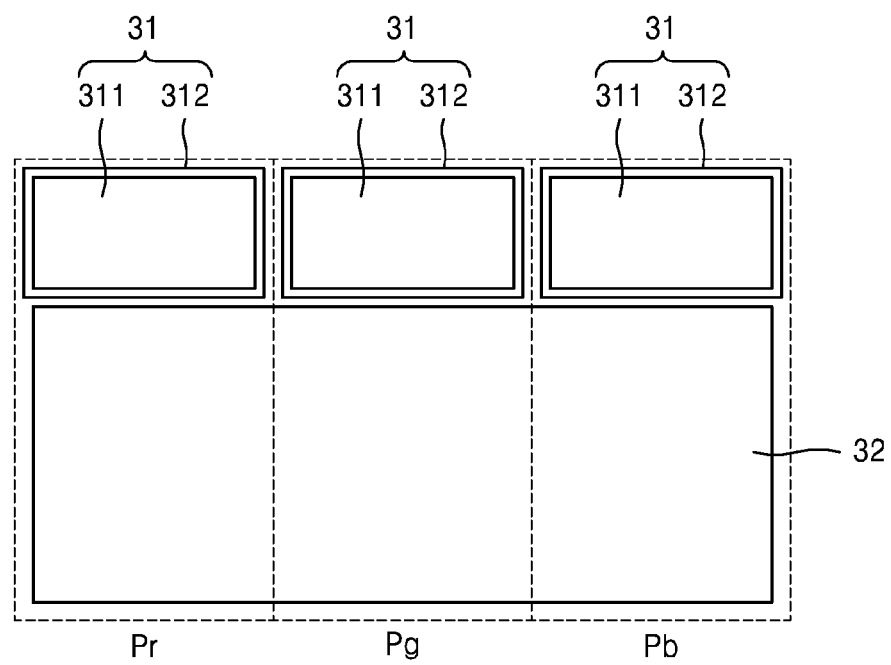

FIG. 4 is a schematic cross-sectional view illustrating a part of a display apparatus 200 according to another embodiment of the present disclosure. FIGS. 5 and 6 are pixels included in the display apparatus 200 of FIG. 4.

The display apparatus 200 of FIG. 4 may be a top emission organic light emitting display apparatus, and may include the first substrate 1, a display unit provided on the first substrate 1, and the second substrate 2 that seals the display unit. The display unit includes a plurality of pixels that each includes the pixel region 31 that emits light in a direction of the first substrate 1 and the transmission region 32 that is adjacent to the pixel region 31 and transmits external light. The plurality of pixels may be aligned in row and column directions in the form of a matrix.

According to an embodiment of the present disclosure, when the display apparatus 200 is in a transparent mode in which light is transmitted, a user at a side where an image is formed may observe an image of an outer side of the first substrate 1 by means of the second external light 62 that is transmitted from the outer side of the first substrate 1 to an outer side of the second substrate 2. A user at an opposite side to where the image is formed may also observe an image of the outer side of the second substrate 2 by means of the first external light 61 that is transmitted from the outer side of the second substrate 2 to the outer side of the first substrate 1. In this embodiment, the second external light 62 travels in a direction from the first substrate 1 toward the second substrate 2, and the first external light 61 travels an opposite direction to that of the second external light 62.

When the display apparatus 200 is a black mode in which light is not transmitted, the user at the side where the image is formed may not observe the image of the outer side of the first substrate 1. The user at the opposite side to where the image is formed may also not observe the image of the outer side of the second substrate 2.

Each of the pixels may include a plurality of sub pixels, for example, a red sub pixel Pr, a green sub pixel Pg, and a blue sub pixel Pb. Each of the sub pixels, Pr, Pg, and Pb, includes the pixel region 31 and the transmission region 32. The pixel region 31 includes the pixel circuit unit 311 and the emission unit 312. The pixel circuit unit 311 and the emission unit 312 are disposed to overlap with each other.

The thin film transistor TR is disposed in the pixel circuit unit 311. The OLED emission device EL is disposed in the emission unit 312. Unlike FIG. 1, in FIG. 4, the pixel circuit unit 311 and the emission unit 312 of the pixel region 31 are disposed to overlap with each other. The emission unit 312 is a top emission type in which light is emitted in a direction of the second substrate 2, and thus the pixel circuit unit 311 and the emission unit 312 may overlap with each other. In addition, the emission unit 312 hides the pixel circuit unit 311 including a pixel circuit, and thus, light interference due to the pixel circuit is reduced.

According to the present embodiment of FIG. 4, the first electrode 221 may have a stack structure comprising a transparent conductor and a reflective layer, and where the second electrode may be a semi-reflective semi-transmission electrode. The transparent conductor may include ITO, IZO, ZnO, or $In_2O_3$ having a high work function. The reflective layer may include at least one metal selected from the group consisting of Ag, Mg, Al, Pt, Pd, Au, Ni, Nd, Ir, Cr, Li, Ca, Mo, or any alloy of these. In this embodiment, the first electrode 221 is formed in the pixel region 31.

The second electrode 222 may be formed of Ag, Mg, Al, Pt, Pd, Au, Ni, Nd, Ir, Cr, Li, Ca, Mo, or any alloy of these. In this embodiment, the second electrode 222 may be formed as a thin film of a thickness in the range of about 100 Å to about 300 nm so as to increase transmittance. This embodiment may produce a top emission type OLED in which an image is formed in a direction of the second electrode 222.

Functions of the other elements are similar to those of corresponding elements of FIG. 1 described above, and thus detailed descriptions thereof are omitted.

The transmission regions 32 may be independent from other transmission regions of sub pixels Pr, Pg, and Pb, as shown in FIG. 5, or may be connected to act as a shared transmission window in the sub pixels Pr, Pg, and Pb, as shown in FIG. 6.

Figure 7:
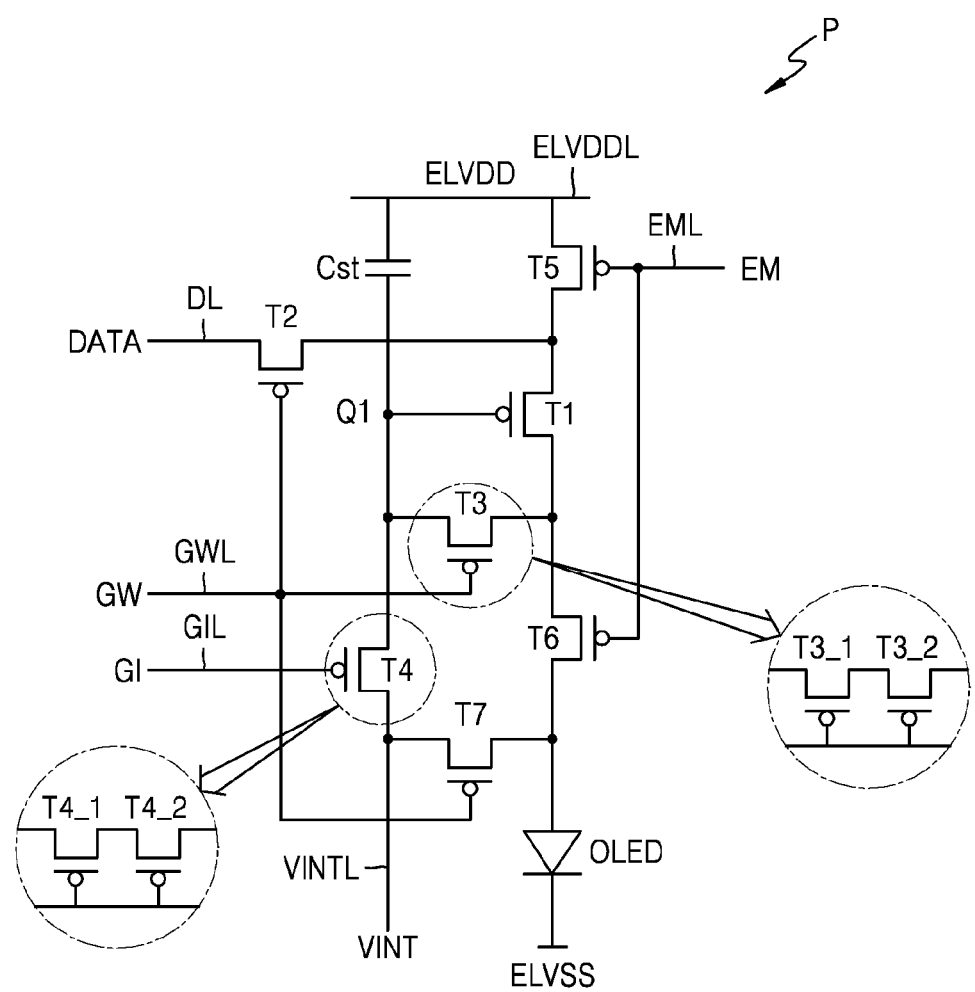
FIG. 7 is an equivalent circuit diagram of a single sub pixel according to an embodiment of the present disclosure

FIG. 7 is an equivalent circuit diagram of a single sub pixel P according to an embodiment of the present disclosure.

A pixel circuit unit of the sub pixel P includes a plurality of thin film transistors T1 through T7 and a capacitor Cst, and an emission unit thereof including the OLED.

The thin film transistors T1 through T7 include the driving transistor T1, the switching transistor T2, the compensation transistor T3, the initialization transistor T4, the first emission control transistor T5, the second emission control transistor T6, and the bypass transistor T7. A first electrode of each of the thin film transistors T1 through T7 is one of a source electrode and a drain electrode, and a second electrode thereof is another one.

The sub pixel P is connected to a first control line GWL that transfers the first gate control signal GW to the switching transistor T2, the compensation transistor T3, and the bypass transistor T7, a second control line GIL that transfers a second gate control signal G1 to the initialization transistor T4, an emission control line EML that transfers an emission control signal EM to the first emission control transistor T5 and the second emission control transistor T6, a data line DL that transfers a data signal DATA, a driving voltage line ELVDDL that transfers a first power voltage ELVDD, and an initialization voltage line VINTL that transfers an initialization voltage VINT.

A gate electrode of the driving transistor T1 is connected to a first node Q1, a first electrode thereof is connected to the driving voltage line ELVDDL via the first emission control transistor T5, and a second electrode thereof is electrically connected to an anode of the OLED via the second emission control transistor T6. A current (a driving current) flowing to the OLED is determined according to a voltage difference between the gate electrode and the second electrode of the driving transistor T1.

A gate electrode of the switching transistor T2 is connected to the first control line GWL, a first electrode thereof is connected to the data line DL, and a second electrode thereof is connected to the first electrode thereof. According to the first gate control signal GW transferred through the first control line GWL, the switching transistor T2 is turned on to transfer the data signal DATA applied via the data line DL to the first electrode of the driving transistor T1, and transfer the data signal DATA the gate electrode thereof, and the compensation transistor T3 is simultaneously turned on, and the data signal DATA is transferred to the gate electrode of the driving transistor T1.

A gate electrode of the compensation transistor T3 is connected to the first control line GWL, a first electrode thereof is connected to the second electrode of the driving transistor T1, and a second electrode is connected to the first node Q1. The compensation transistor T3 is turned on according to the first gate control signal GW transferred through the first control line GWL to connect the gate electrode and the second electrode of the driving transistor T1 to each other, diode-connect the driving transistor T1, and compensate for a threshold voltage Vth of the driving transistor T1. The compensation transistor T3 may be implemented as a multi-gate type in which a first compensation transistor T3_1 and a second compensation transistor T3_2 are in series connected to each other.

A gate electrode of the initialization transistor T4 is connected to the second control line GIL, a first electrode thereof is connected to the first node Q1, and a second electrode thereof is connected to the initialization voltage line VINTL. The initialization transistor T4 is turned on to transfer the initialization voltage VINT to the first node Q1 and initialize the first node Q1. The initialization voltage VINT may be set as a voltage higher than a second power voltage EVLSS or the second power voltage EVLSS. The initialization transistor T4 may be implemented as a multi-gate type in which a first initialization transistor T4_1 and a second initialization transistor T4_2 are in series connected to each other.

In an embodiment of the present disclosure, the compensation transistor T3 and the initialization transistor T4 are configured as multi-gate transistors. Accordingly, when the switching transistor T2, the compensation transistor T3, and the initialization transistor T4 are turned off, a leakage of current may be prevented, and data may be stably maintained in the capacitor Cst.

A gate electrode of the first emission control transistor T5 is connected to the emission control line EML, a first electrode thereof is connected to the driving voltage line ELVDDL, and a second electrode thereof is connected to the first electrode of the driving transistor T1.

A gate electrode of the second emission control transistor T6 is connected to the emission control line EML, a first electrode thereof is connected to the second electrode of the driving transistor T1, and a second electrode thereof is electrically connected to the anode of the OLED. The first emission control transistor T5 and the second emission control transistor T6 are simultaneously turned on according to the emission control signal EM applied from the emission control line EML to apply the first power voltage ELVDD to the driving transistor T1 and allow the driving current to flow to the OELD.

A gate electrode of the bypass transistor T7 is connected to the first control line GWL, a first electrode thereof is connected to the anode of the OLED, and a second electrode thereof is connected to the initialization voltage line VINTL. The bypass transistor T7 is turned on by the first gate control signal GW applied from the first control line GWL to initialize the anode of the OLED.

The capacitor Cst is connected between the driving voltage line ELVDDL and the first node Q1. A first electrode of the capacitor Cst is connected to the gate electrode of the driving transistor T1, the second electrode of the compensation transistor T3, and the first electrode of the initialization transistor T4. A second electrode of the capacitor Cst is connected to the driving voltage line ELVDDL. An electrical charge is stored in the capacitor Cst between the first power voltage ELVDD and the first node Q1.

A cathode of the OLED is connected to the second power voltage ELVSS. The OLED receives a driving current from the driving transistor T1 and emits light to display an image. The first power voltage ELVDD may be a predetermined high level voltage. The second power voltage ELVSS may be a voltage lower than the first power voltage EVLDD or a ground voltage.

In an embodiment of the present disclosure, the compensation transistor T3 and the initialization transistor T4 are formed as multi-gate transistors while the initialization transistor T4 is shared between at least two of sub pixels of a pixel so as to secure an optimal space of the transmission region 32 during a layout design.

Figure 8:
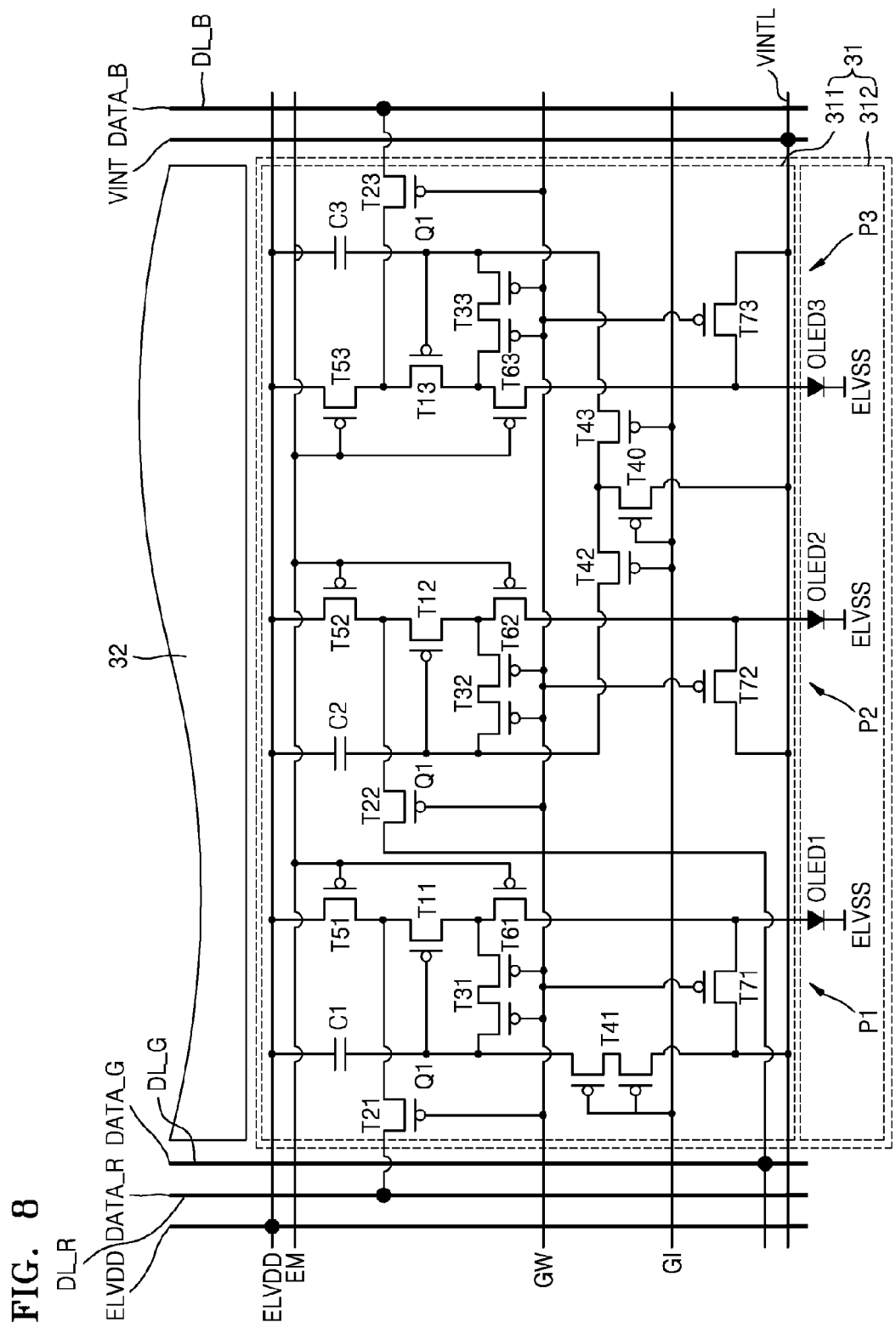
FIG. 8 is an equivalent circuit diagram of a pixel according to an embodiment of the present disclosure.

FIG. 8 is an equivalent circuit diagram of a pixel according to an embodiment of the present disclosure.

A single pixel may include a plurality of sub pixels. FIG. 8 shows the pixel regions 31 of a first sub pixel P1, a second sub pixel P2, and a third sub pixel P3 that are included in the pixel, and the transmission regions 32 that are connected to each other throughout the first sub pixel P1, the second sub pixel P2, and the third sub pixel P3. The pixel circuit unit 311 and the emission unit 312 are disposed in the pixel regions 31 of the first sub pixel P1, the second sub pixel P2, and the third sub pixel P3. The emission unit 312 may be disposed to or not to overlap with each other. The emission unit 312 may be disposed between the pixel circuit unit 311 and the transmission region 32.

The pixel circuit unit 311 of the first sub pixel P1 includes a driving transistor T11, a switching transistor T21, a compensation transistor T31, an initialization transistor T41, a first emission control transistor T51, a second emission control transistor T61, a bypass transistor T71, and a capacitor C1. The switching transistor T21 of the first sub pixel P1 receives a first data signal DATA_R from a first data line and transfers the first data signal DATA_R to a first electrode of a driving transistor T11. The pixel circuit unit 311 of the first sub pixel P1 is electrically connected to OLED1 of the emission unit 312.

The pixel circuit unit 311 of the second sub pixel P2 includes a driving transistor T12, a switching transistor T22, a compensation transistor T32, an initialization transistor T42, a first emission control transistor T52, a second emission control transistor T62, a bypass transistor T72, and a capacitor C2. The switching transistor T22 of the second sub pixel P2 receives a second data signal DATA_G from a second data line and transfers the second data signal DATA_G to a first electrode of a driving transistor T12. The pixel circuit unit 311 of the second sub pixel P2 is electrically connected to OLED2 of the emission unit 312.

The pixel circuit unit 311 of the third sub pixel P3 includes a driving transistor T13, a switching transistor T23, a compensation transistor T33, an initialization transistor T43, a first emission control transistor T53, a second emission control transistor T63, a bypass transistor T73, and a capacitor C3. The switching transistor T23 of the third sub pixel P3 receives a third data signal DATA_B from a third data line and transfers the third data signal DATA_B to a first electrode of a driving transistor T13. The pixel circuit unit 311 of the third sub pixel P3 is electrically connected to OLED3 of the emission unit 312.

Each of the compensation transistor T31 and the initialization transistor T41 of the first sub pixel P1 is implemented as a multi-gate transistor.

Each of the compensation transistor T32 of the second sub pixel P2 and the compensation transistor T33 of the third sub pixel P3 is implemented as a multi-gate transistor.

The initialization transistor T42 of the second sub pixel P2 and the initialization transistor T43 of the third sub pixel P3 are connected to a shared transistor T40 to implement a multi-gate transistor.

That is, the initialization transistor T41 of the first sub pixel P1 is solely implemented as the multi-gate transistor, whereas each of the initialization transistor T42 of the second sub pixel P2 and the initialization transistor T43 of the third sub pixel P3 is configured as a single-gate transistor, connected to the shared transistor T40, and implemented as the multi-gate transistor.

A gate electrode of the shared transistor T40, along with gate electrodes of the initialization transistor T42 and the initialization transistor T43, is connected to the second control line GIL, a first electrode thereof is connected to second electrodes of the initialization transistor T42 and the initialization transistor T43, and a second electrode thereof is connected to the initialization voltage line VINTL. Thus, the shared transistor T40 allows the initialization transistor T42 of the second sub pixel P2 to be implemented as the multi-gate transistor, and the initialization transistor T43 of the third sub pixel P3 to be implemented as the multi-gate transistor.

The initialization transistor T42 of the second sub pixel P2 and the initialization transistor T43 of the third sub pixel P3 are implemented as the multi-gate transistors by the shared transistor T40, thereby reducing a layout area of the pixel circuit unit 311 compared to a case where each of the second sub pixel P2 and the third sub pixel P3 is implemented as the multi-gate transistor, and thus the transmission area 32 may be further secured.

In an embodiment of the present disclosure, a sub pixel having a relatively high voltage difference ΔVds between source and drain of an initialization transistor connected to the first node Q1 connected to a gate electrode of a driving transistor among a plurality of sub pixels is solely implemented as the multi-gate transistor, and sub pixels having relatively low voltage difference ΔVds between source and drain are implemented as the multi-gate transistor by connecting single gate transistor to a shared transistor. Thus, an area of the pixel circuit unit 311 of a unit pixel is reduced, thereby increasing an area of the transmission region 32.

In the present embodiment, the first sub pixel P1, the second sub pixel P2, and the third sub pixel P3 may be respectively the red sub pixel Pr, the green sub pixel Pg, and the blue sub pixel Pb.

Figure 9:
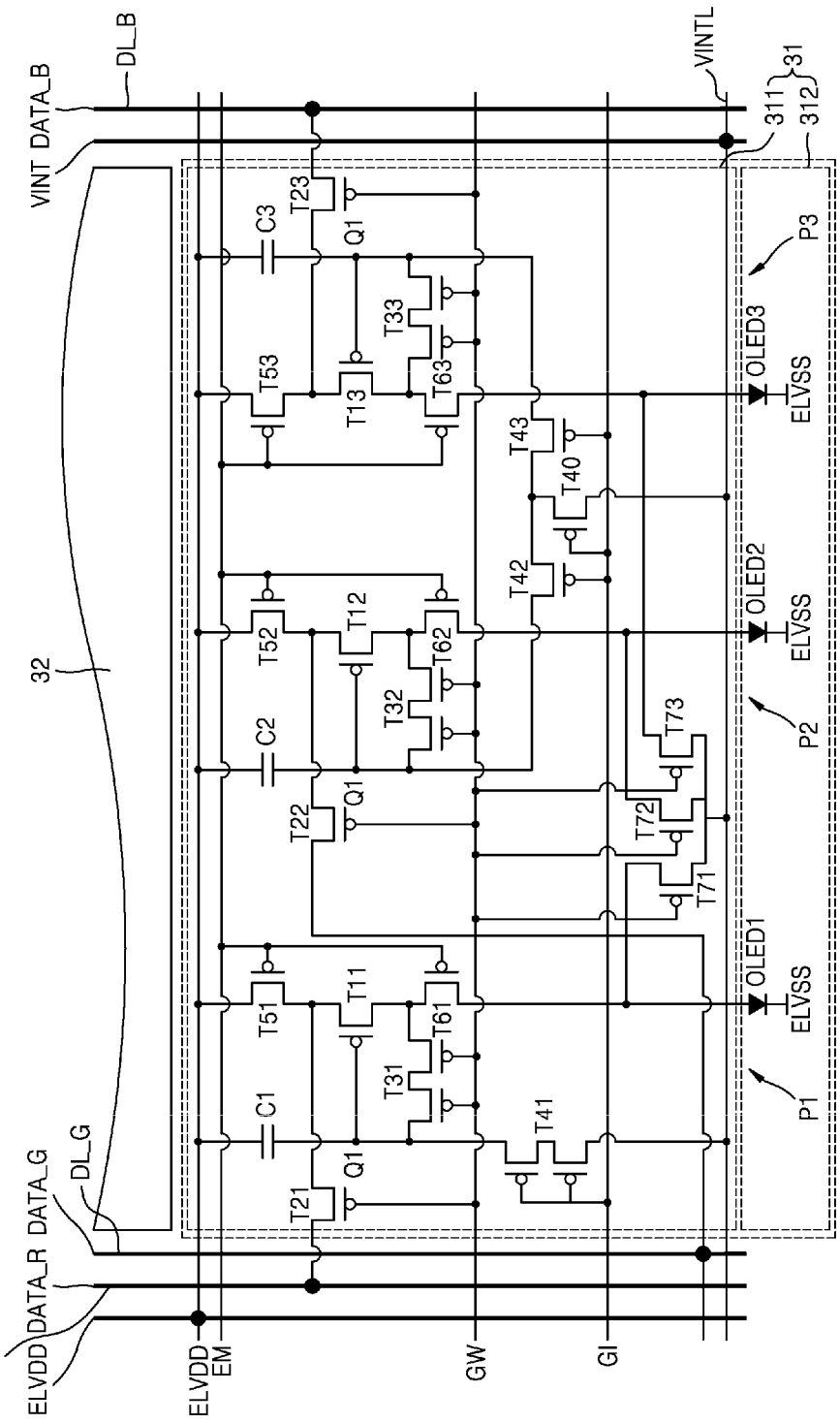
FIG. 9 is an equivalent circuit diagram of a pixel according to another embodiment of the present disclosure.

FIG. 9 is an equivalent circuit diagram of a pixel according to another embodiment of the present disclosure.

In FIG. 9, in addition to FIG. 8, the bypass transistors T71, T72, and T73 of the first sub pixel P1, the second sub pixel P2, and the third sub pixel P3, respectively, are disposed to be adjacent to each other.

The initialization transistor T42 of the second sub pixel P2 and the initialization transistor T43 of the third sub pixel P3 are implemented as a multi-gate transistor by the shared transistor T40. The bypass transistors T71, T72, and T73 of the first sub pixel P1, the second sub pixel P2, and the third sub pixel P3, respectively, are adjacent to the initialization voltage line VINTL in a horizontal direction and are connect to each other, and thus the initialization voltage VINT may be applied only by using the single initialization voltage line VINTL. Accordingly, a layout area of the pixel circuit unit 31 may be further reduced, thereby further securing the transmission region 32.

Figure 10:
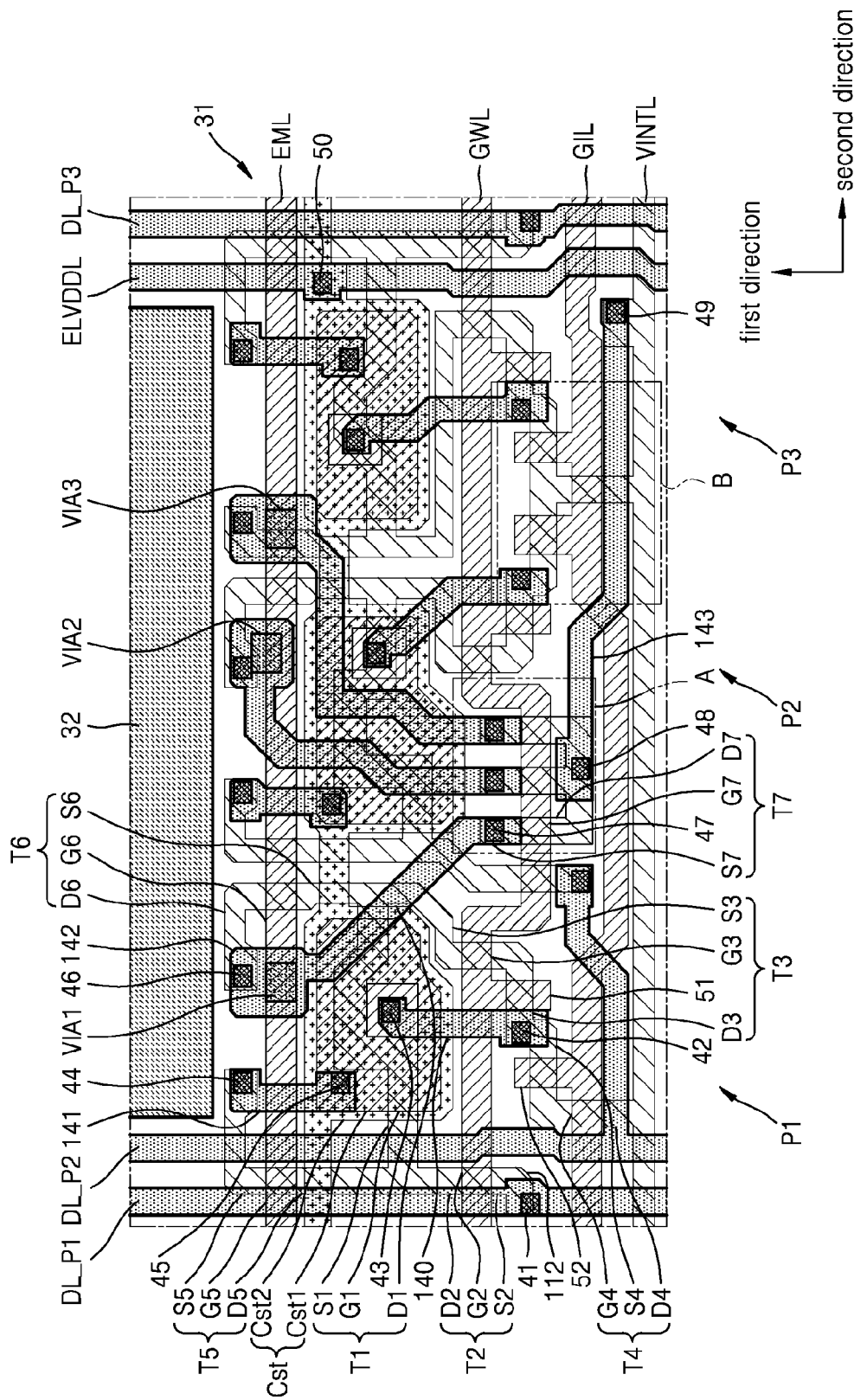
FIG. 10 is a plan view of a substrate including the pixel of FIG. 9.
Figure 11:
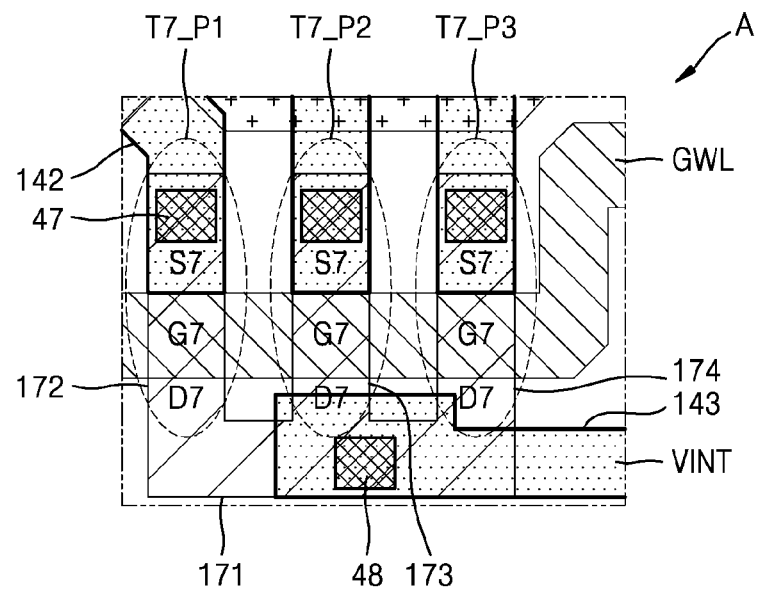
FIGS. 11 and 12 are enlarged views of regions of FIG. 10.
Figure 12:
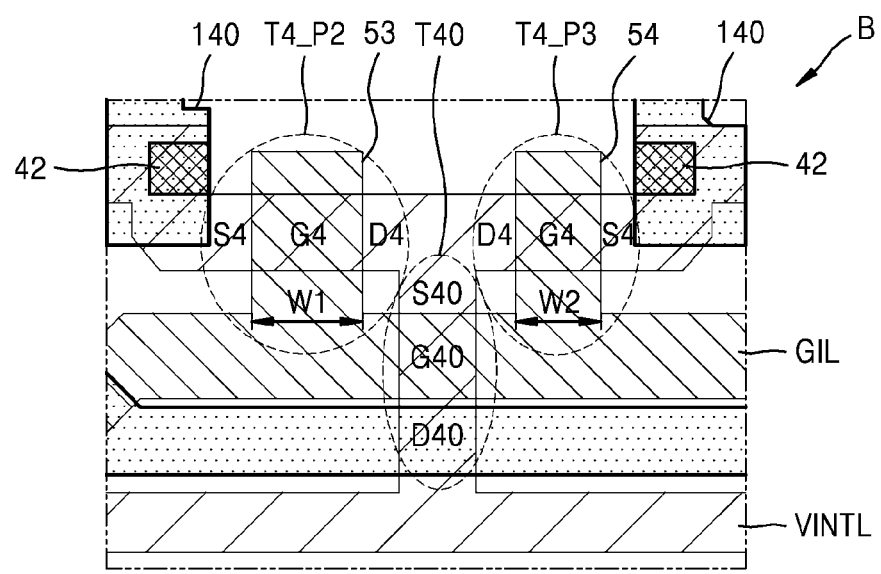

FIG. 10 is a plan view of a substrate including the pixel of FIG. 9. FIGS. 11 and 12 are enlarged views of regions A and B of FIG. 10, respectively.

Referring to FIG. 10, a unit pixel including the first sub pixel P1, the second sub pixel P2, and the third sub pixel P3 is formed on a thin film transistor substrate of an OLED apparatus according to an embodiment of the present disclosure. Each of the first sub pixel P1, the second sub pixel P2, and the third sub pixel P3 includes the pixel region 31 including a pixel circuit unit and the transmission region 32.

The transistors T1 through T7 and the capacitor Cst are formed in each of the first sub pixel P1, the second sub pixel P2, and the third sub pixel P3. Although not shown, the OLED is formed in each of regions of the first sub pixel P1, the second sub pixel P2, and the third sub pixel P3 corresponding to via holes VIA1, VIA2, and VIA3 so that the OLED apparatus is a top emission type.

The first sub pixel P1 only will be described below, and differences between the second sub pixel P2 and the third sub pixel P3 and the first sub pixel P1 will be described below.

The transistors T1 through T7 are formed along the active layer 112 that is curved in various shapes. The active layer 112 is formed of polysilicon and includes a channel region that is not doped with impurities and a source region and a drain region that are doped with impurities in both sides of the channel region. Impurities vary according to types of thin film transistors, and may be N type impurities or P type impurities.

A first insulating layer may be formed on the active layer 112. The emission control line EML applying the emission control signal EM, the first control line GWL applying the first gate control signal GW, and the second control line GIL applying the second gate control signal G1, extends in the second direction and is formed on the first insulating layer. The emission control line EML, the first control line GWL, and the second control line GIL may be formed of the same material on the same layer. In this embodiment, a first electrode Cst1 of the capacitor Cst may be formed on the first insulating layer.

A second insulating layer may be formed on the emission control line EML, the first control line GWL, and the second control line GIL. A second electrode Cst2 of the capacitor Cst may be formed on the second insulating layer.

A third insulating layer may be formed on the second electrode Cst2 of the capacitor Cst. Data lines DL_P1, DL_P2, and DL_P3 that apply the data signal DATA to each sub pixel and extend in a first direction perpendicular to the second direction and the driving voltage line ELVDDL that applies the first power voltage ELVDD are disposed on the third insulating layer. The data lines DL_P1, DL_P2, and DL_P3 and the driving voltage line ELVDDL may be formed of the same material on the same layer. In this regard, a plurality of electrode connection wirings may be formed on the third insulating layer.

The initialization voltage line VINTL may extend in the second direction and may be formed of the same material on the same layer with the active layer 112. Although not shown, the initialization voltage line VINTL may be connected to a vertical wiring extending in the first direction parallel to the driving voltage line ELVDDL to implement a mesh structure. The vertical wiring may be formed on a different layer from that of the driving voltage line ELVDDL with the insulating layer therebetween.

The driving transistor T1 includes a gate electrode G1 formed as the first electrode Cst1 of the capacitor Cst, and a source electrode S1 and a drain electrode D1 as a source region and a drain region doped with impurities on the active layer 112. A channel region is a region overlapping with the gate electrode G1 between the source region and the drain region of the active layer 112. The channel region may be formed in multiple directions and in a small space.

As described above, the active layer 112 may be formed in a small space. Thus, the long channel region may be formed in the active layer 112 of the driving transistor T1, thereby increasing a driving range of a gate voltage applied to a gate electrode. Therefore, an increase in the driving range of the gate voltage changes a value of the gate voltage, thereby allowing for more minute control of gradation of light emitted from the OELD, and thus resolution of an OLED apparatus may be increased and display quality may be improved. The shape of the active layer 112 of the driving transistor T1 may be "己", "S", "M", "W", etc. in various embodiments.

The switching transistor T2 includes a gate electrode G2 formed as a part of the first control line GWL, and a source electrode S2 and a drain electrode D2 as a source region and a drain region doped with impurities on the active layer 112. A channel region is a region overlapping with the gate electrode G2 between the source region and the drain region on the active layer 112. The source electrode S2 is connected to the data line DL_P1 via a contact hole 41. The drain electrode D2 is directly connected to the source electrode S1 of the driving transistor T1 and a drain electrode D5 of the first emission control transistor T5.

The compensation transistor T3 includes a gate electrode G3 formed as a part of the first control line GWL, and a source electrode S3 and a drain electrode D3 as a source region and a drain region doped with impurities on the active layer 112. A channel region is a region overlapping with the gate electrode G3 between the source region and the drain region on the active layer 112. The gate electrode G3 is formed as a multi-gate electrode by a branch line 51 of the first control line GWL. The source electrode S3 is directly connected to the drain electrode D1 of the driving transistor T1 and a source electrode S6 of the second emission control transistor T6. The drain electrode D3 is directly connected to a source electrode S4 of the initialization transistor T4, and is connected to a first connection member 140 via a contact hole 42. The first connection member 140 is connected to the gate electrode G1 of the driving transistor T1 and the first electrode Cst1 of the capacitor Cst via a contact hole 43. Thus, the drain electrode D3 is connected to the gate electrode G1 of the driving transistor T1 and the first electrode Cst1 of the capacitor Cst.

The initialization transistor T4 includes a gate electrode G4 formed as a part of the second control line GIL, and a source electrode S4 and a drain electrode D4 as a source region and a drain region doped with impurities on the active layer 112. A channel region is a region overlapping with the gate electrode G4 between the source region and the drain region on the active layer 112. The gate electrode G4 is formed as a multi-gate electrode by a branch line 52 of the second control line GIL. The source electrode S4 is connected to the first connection member 140 via the contact hole 42 and is connected to the gate electrode G1 of the driving transistor T1 and the first electrode Cst1 of the capacitor Cst. The drain electrode D4 is directly connected to the initialization voltage line VINTL.

The first emission control transistor T5 includes a gate electrode G5 formed as a part of the emission control line EML, and a source electrode S5 and a drain electrode D5 as a source region and a drain region doped with impurities on the active layer 112. A channel region is a region overlapping with the gate electrode G5 between the source region and the drain region on the active layer 112. The source electrode S5 is connected to a second connection member 141 via a contact hole 44. The second connection member 141 is connected to the second electrode Cst2 of the capacitor Cst via a contact hole 45. The second electrodes Cst2 of the capacitors Cst of adjacent pixels are connected to each other, and are connected to the driving voltage line ELVDDL via a contact hole 50. Thus, the source electrode S5 is connected to the driving voltage line ELVDDL. The drain electrode D5 is directly connected to the source electrode S1 of the driving transistor T1 and the drain electrode D2 of the switching transistor T2.

The second emission control transistor T6 includes a gate electrode G6 formed as a part of the emission control line EML, and a source electrode S6 and a drain electrode D6 as a source region and a drain region doped with impurities on the active layer 112. A channel region is a region overlapping with the gate electrode G6 between the source region and the drain region on the active layer 112. The source electrode S6 is connected to the drain electrode D1 of the driving transistor T1 and the source electrode S3 of the compensation transistor T3. The drain electrode D6 is connected to a third connection member 142 via a contact hole 46 and a via hole VIA and is connected to an anode electrode of the OLED.

The bypass transistor T7 includes a gate electrode G7 formed as a part of the first control line GWL, and a source electrode S7 and a drain electrode D7 as a source region and a drain region doped with impurities on the active layer 112. A channel region is a region overlapping with the gate electrode G7 between the source region and the drain region on the active layer 112. The source electrode S7 is connected to the third connection member 142 via a contact hole 47 and is connected to the anode electrode of the OLED. The drain electrode D7 is connected to a fourth connection member 143 via a contact hole 48. The fourth connection member 143 is connected to the initialization voltage line VINTL via a contact hole 49. Thus, the drain electrode D7 is connected to the initialization voltage line VINTL.

The first electrode Cst1 of the capacitor Cst is connected to the first connection member 140 via the contact hole 43. The first electrode Cst1 of the capacitor Cst serves as the gate electrode G1 of the driving transistor T1. The first electrode Cst1 of the capacitor Cst is separated from adjacent pixels and is formed in the form of an island. The first electrode Cst1 of the capacitor Cst may be formed on the same material as those of the emission control line EML the first control line GWL, and the second control line GIL on the same layer.

The second electrode Cst2 of the capacitor Cst is connected to the driving voltage line EVLDDL via a contact hole 50 and receives the first power voltage ELVDD from the driving voltage line ELVDDL. The second electrode Cst2 of the capacitor Cst is connected to second electrodes of capacitors of adjacent pixels in a second direction and is connected to the driving voltage line ELVDDL extending in a first direction. Thus, the driving voltage line ELVDDL may implement a mesh structure by the second electrode Cst2 of the capacitor Cst. The second electrode Cst2 of the capacitor Cst has a structure in which the second electrode Cst2 of the capacitor Cst overlaps with the entire first electrode Cst1 and vertically overlaps with the driving transistor T1. The capacitor Cst is formed by overlapping with the active layer 112 of the driving transistor T1 having a curved shape so as to secure a region of the capacitor Cst that is reduced by the active layer 112 of the driving transistor T1, thereby securing a high resolution capacitance. The second electrode Cst2 of the capacitor Cst has an opening such that the first connection member 140 is connected to the first electrode Cst1 of the capacitor Cst via the contact hole 43.

The bypass transistors T7 of the first sub pixel P1, the second sub pixel P2, and the third sub pixel P3 are closely disposed in the region A adjacent to the initialization voltage line VINTL between the first sub pixel P1 and the second sub pixel P2.

Referring to FIG. 11, bypass transistors T7_P1, T7_P2, and T7_P3 of the first sub pixel P1, the second sub pixel P2, and the third sub pixel P3, respectively, are closely disposed in parallel in the region A between the second sub pixel P2 and the third sub pixel P3.

The gate electrodes G7 of the bypass transistors T7_P1, T7_P2, and T7_P3 of the first sub pixel P1, the second sub pixel P2, and the third sub pixel P3 are formed as a part of the first control lien GWL and are connected to each other.

Active layers of the bypass transistors T7_P1, T7_P2, and T7_P3 are in the form of the capital letter "E" as a whole. A first active layer 172 that is the active layer of the bypass transistor T7_P1 of the first sub pixel P1, a second active layer 173 that is the active layer of the bypass transistor T7_P2 of the second sub pixel P2, and a third active layer 174 that is the active layer of the bypass transistor T7_P3 of the third sub pixel P3 have straight line shapes and are connected to each other by a fourth active layer 171.

The bypass transistors T7_P1, T7_P2, and T7_P3 include source regions and drain regions that are doped with impurities as source electrodes S7 and drain electrodes D7 in the first active layer 172, the second active layer 173, and the third active layer 174. Each of the source electrodes S7 is connected to the third connection member 143 via the contact hole 47. Each of the drain electrodes D7 is directly connected to a fourth active layer 171, is connected to the fourth connection member 143 via the contact hole 48, and receives the initialization voltage VINT.

The bypass transistors T7_P1, T7_P2, and T7_P3 of the first sub pixel P1, the second sub pixel P2, and the third sub pixel P3 are closely disposed in a region, do not need each initialization voltage line VINTL, and are connected to a single initialization voltage line VINTL, thereby reducing an area of a pixel circuit unit.

Referring to FIG. 12, initialization transistors T4_P2 and T4_P3 of at least two of the first sub pixel P1, the second sub pixel P2, and the third sub pixel P3, for example, the second sub pixel P2 and the third sub pixel P3, are connected to the shared transistor T40 to implement a double-gate transistor.

The shared transistor T40 includes a gate electrode G40 formed as a part of the second control line GIL, and a source electrode S40 and a drain electrode D40 as a source region and a drain region doped with impurities on the active layer 112. The source electrode S40 is directly connected to the drain electrodes D4 of the initialization transistors T4_P2 and T4_P3 of the second sub pixel P2 and the third sub pixel P3. The drain electrode D40 is directly connected to the initialization voltage line VINTL.

The gate electrodes G4 of the initialization transistor T4_P2 of the second sub pixel P2 and the initialization transistor T4_P3 of the third sub pixel P3 are formed as a part of branch lines 53 and 54 of the second control line GIL, respectively, and are connected to each other. A source region and a drain region doped with impurities on the active layer 112 are respectively the source electrode S4 and the drain electrode D4 of the initialization transistors T4_P2 and T4_P3. Each of the source electrodes S4 is connected to the first connection member 140 via the contact hole 42. The drain electrodes D4 of the initialization transistors T4_P2 and T4_P3 are connected to each other, and are directly connected to the source electrode S40 of the shared transistor T40.

In this embodiment, the width of the gate electrode G4 of the initialization transistor T4 of one of the second sub pixel P2 and the third sub pixel P3 that is vulnerable to brightness (e.g. a pixel that needs a minimization of brightness loss, considering a leakage current) may be increased, and a width of the gate electrode G4 of the initialization transistor T4 of one of the second sub pixel P2 and the third sub pixel P3 that is vulnerable to visibility may be reduced. For example, a width W1 (or a channel length) of the gate electrode G4 of the initialization transistor T4_P2 of the second sub pixel P2 may be greater than a width W2 (or a channel length) of the gate electrode G4 of the initialization transistor T4_P3 of the third sub pixel P3. The second sub pixel P2 may be the green sub pixel Pg having a weak visibility. The third sub pixel P3 may be the blue sub pixel Pb.

In the present specification, a pixel may mean a single sub pixel or a single unit pixel including a plurality of sub pixels. That is, although it is described that a single pixel is provided in the present specification, this may mean that a single sub pixel is provided or a single unit pixel including a plurality of sub pixels is provided. The unit pixel includes red, green, and blue sub pixels in the above-described embodiment but is not limited thereto. The unit pixel may u) further include sub pixels that emit light of other colors. For example, the unit pixel may include sub pixels that emit light of red, green, blue and/or white.

A pixel includes P type transistors in the above-described embodiment but is not limited thereto. The pixel may be configured as N type transistors or a mixture of N type transistors and P type transistors.

A transparent display apparatus includes an OLED in the above-described embodiment but is not limited thereto. Various transparent display apparatuses including a liquid crystal device may be applicable. In addition to the transparent display apparatus, a display apparatus that secures an opening ratio by minimizing a circuit area may also be applicable.

As described above, according to the one or more of the embodiments of the present disclosure, a transparent display apparatus may maximize an area of a transmission unit by minimizing a circuit area of a non-transmission unit, thereby improving transmittance.

It should be understood that the exemplary embodiments described herein should be considered in a descriptive sense only and not for purposes of limitations. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. A thin film transistor substrate, comprising:
    a first pixel, a second pixel adjacent to the first pixel, and a shared transistor,
    wherein each of the first pixel and second pixel comprises:
        a first transistor configured to receive a data signal in response to a first gate control signal;
        a second transistor configured to output a driving current according to the data signal applied to a gate electrode of the second transistor;
        a third transistor configured to initialize the gate electrode of the second transistor in response to a second gate control signal, and
    wherein the shared transistor has a gate electrode connected to a gate electrode of the third transistor of the first pixel and a gate electrode of the third transistor of the second pixel, a first electrode connected the second electrodes of the third transistors of the first pixel and the second pixel, and a second electrode connected to an initialization voltage line applying an initialization voltage.

2. The thin film transistor substrate of claim 1, wherein the gate electrode of the third transistor of the first pixel and the gate electrode of the third transistor of the second pixel are different in width.

3. The thin film transistor substrate of claim 1, further comprising a third pixel adjacent to the first pixel or the second pixel:
    wherein the third pixel comprises:
        a first transistor configured to receive a data signal in response to the first gate control signal;
        a second transistor configured to output a driving current according to the data signal applied to a gate electrode of the second transistor of the third pixel;
        a third transistor configured to initialize a gate electrode of the second transistor of the third pixel in response to the second gate control signal, and
    wherein the third transistor of the third pixel has two sub-transistors that are connected to each other in series.

4. The thin film transistor substrate of claim 3, wherein:
one of the two sub-transistors is connected to the gate electrode of the second transistor of the third pixel, and
the other of the two sub-transistors is connected to an initialization voltage line.

5. The thin film transistor substrate of claim 3, wherein:
each of the first pixel, the second pixel, and the third pixel further comprises:
a fourth transistor having a first electrode connected to one electrode of an emission device, a second electrode receiving the initialization voltage and a gate electrode receiving the first gate control signal,
wherein the fourth transistors of the first pixel, the second pixel, and the third pixel are disposed in proximity with one another.

6. The thin film transistor substrate of claim 5, wherein:
gate electrodes of the fourth transistors of the first pixel, the second pixel, and the third pixel are directly connected to each other,
and
second electrodes of the fourth transistors of the first pixel, the second pixel, and the third pixel are directly connected to each other.

7. The thin film transistor substrate of claim 3, wherein each of the first pixel, the second pixel, and the third pixel further comprises:
a fifth transistor configured to diode-connect the second transistor in response to the first gate control signal.

8. The thin film transistor substrate of claim 7, wherein:
the data signal is applied to a first electrode of the second transistor via the first transistor, and
the second transistor is diode-connected by the fifth transistor to transfer the data signal of the first electrode of the second transistor to the gate electrode of the second transistor.

9. The thin film transistor substrate of claim 7, wherein the fifth transistor comprises two sub-transistors that are connected to each other in series.

10. The thin film transistor substrate of claim 3, wherein:
the first pixel, the second pixel, and the third pixel emit light of different colors and each of first pixel, the second pixel, and the third pixel is one of
a red pixel,
a green pixel, and
a blue pixel.

11. The thin film transistor substrate of claim 10, wherein the first pixel is a green pixel and the second pixel is a blue pixel.

12. The thin film transistor substrate of claim 10, wherein:
each of the red pixel, the green pixel, and the blue pixel comprises:
a fourth transistor configured to initialize one electrode of an emission device in response to the first gate control signal,
wherein the fourth transistors of the red pixel, the green pixel, and the blue pixel are disposed in parallel, and
the fourth transistors of the red pixel, the green pixel, and the blue pixel are disposed in close proximity to each other such that the fourth transistors are disposed between the red pixel and one of the green pixel and the blue pixel, and
the one of the green pixel and the blue pixel is adjacent to the red pixel.

13. The thin film transistor substrate of claim 3, wherein each of the first pixel, the second pixel, and the third pixel comprises:
a first region that emits light; and
a second region that is adjacent to the first region and transmits external light, wherein the first transistor, the second transistor, and the third transistor are disposed in the first region.

14. The thin film transistor substrate of claim 13, wherein the second regions of the first pixel, the second pixel, and the third pixel are connected to each other.

15. The thin film transistor substrate of claim 13, wherein:
each of the first pixel, the second pixel, and the third pixel further comprises a display device in the first region, and the display device is disposed to overlap the first transistor, the second transistor, and the third transistor.

16. The thin film transistor substrate of claim 1, further comprising:
a data line extending in a first direction that is configured to apply the data signal to the first pixel and the second pixel;
a first control line extending in a second direction that is configured to apply the first gate control signal to the first pixel and the second pixel;
a second control line extending in the second direction that is configured to apply the second gate control signal to the first pixel and the second pixel; and
an initialization voltage line extending in the second direction that is configured to apply the initialization voltage to the first pixel and the second pixel.

17. A display apparatus comprising the thin film transistor substrate of claim 1.

18. A thin film transistor substrate, comprising:
a first pixel, a second pixel, and a shared transistor, wherein each of the first pixel and the second pixel comprises:
a first transistor having a first electrode connected to a data line applying a data signal, a second electrode, and a gate electrode connected to a first control line applying a first gate control signal;
a second transistor having a first electrode connected to the second electrode of the first transistor, a second electrode outputting a driving current corresponding to the data signal, and a gate electrode;
a third transistor having a first electrode connected to the gate electrode of the second transistor, a second electrode connected to a voltage line applying an initialization voltage, and a gate electrode connected to a second control line applying a second gate control signal; and
wherein the shared transistor has a gate electrode connected to the gate electrodes of the third transistors of the first pixel and the second pixel, a first electrode connected to the second electrodes of the third transistors of the first pixel and the second pixel, and a second electrode connected to the initialization voltage line.

* * * * *